United States Patent
Hoene et al.

(10) Patent No.: US 9,130,541 B2
(45) Date of Patent: Sep. 8, 2015

(54) ACTIVE EMC FILTER

(71) Applicant: Schaffner EMV AG, Luterbach (CH)

(72) Inventors: Eckart Hoene, Berlin (DE); Andre Domurat-Linde, Berlin (DE); Oleg Zeiter, Berlin (DE)

(73) Assignee: Schaffner EMV AG (CH)

( * ) Notice: Subject to any disclaimer, the term of this patent is extended or adjusted under 35 U.S.C. 154(b) by 0 days.

(21) Appl. No.: 14/253,293

(22) Filed: Apr. 15, 2014

(65) Prior Publication Data

US 2014/0312966 A1 Oct. 23, 2014

(30) Foreign Application Priority Data

Apr. 19, 2013 (CH) .................................. CH0798/13

(51) Int. Cl.
| | |
|---|---|
| *H03B 1/00* | (2006.01) |
| *H03H 11/04* | (2006.01) |
| *H02M 1/12* | (2006.01) |
| *H02M 1/44* | (2007.01) |

(52) U.S. Cl.
CPC ................ *H03H 11/04* (2013.01); *H02M 1/12* (2013.01); *H02M 1/44* (2013.01); *H02M 2001/123* (2013.01)

(58) Field of Classification Search
CPC .......... H02M 2001/123; H02M 1/126; H02M 1/4233
See application file for complete search history.

(56) References Cited

U.S. PATENT DOCUMENTS

| | | | |
|---|---|---|---|
| 6,636,107 B2 | 10/2003 | Pelly | |
| 6,920,053 B2 | 7/2005 | Honda | |
| 7,061,195 B2 | 6/2006 | Ho et al. | |
| 7,659,797 B2 * | 2/2010 | Tucker | 333/181 |
| 8,842,450 B2 * | 9/2014 | Jungreis et al. | 363/21.03 |
| 8,873,207 B2 * | 10/2014 | Dillig et al. | 361/42 |

FOREIGN PATENT DOCUMENTS

WO   WO-2008020029 A1   2/2008

OTHER PUBLICATIONS

C Mei et al., "Active cancellation common-mode voltages on drives rated 460-V and higher." Electric Machines and Drives Conference, 2003. IEMDC '03 IEEE International Jun. 1-4, 2003. IEEE, vol. 3, pp. 1845-1851.

M. Carmela et al., "Effects of Common-Mode Active Filtering in Induction Motor Drives for Electric Vehicles", IEEE Transactions on Vehicular Technology, IEEE Service Center, vol. 59, No. 6, Jul. 2010, pp. 2664-2673.

(Continued)

*Primary Examiner* — Jeffrey Zweizig
(74) *Attorney, Agent, or Firm* — Blank Rome

(57) ABSTRACT

Active EMC filter connectable between an electric power source and an electric load. The filter has capacitors (CxN, CxU) connected between active conductors of the power source and a star point electric node. A filter capacitor (Cst, CstU) is connected between the star point and ground. A half-bridge has two switching devices (T3, T4; T1, T2) connected in cascade between a positive supply voltage and a negative supply voltage. A smoothing circuit (RgN, LgN; RgU, RgU) is connected between a common node of the switching devices and the star point. A control unit (Drive_N, Drive_U) drives the switching devices (T3, T4; T1, T2) digitally either in an ON-state or in an OFF-state, such as to limit a leakage current.

15 Claims, 4 Drawing Sheets

(56) References Cited

OTHER PUBLICATIONS

A. Acharya et al., "Common mode DC bus filter for Active Front-End converter," Power Electronics, Drives and Energy Systems (PEDES) & 2010 Power India, 2010 Joint International Conference on IEEE, Dec. 20, 2010, pp. 1-6.

M. Carmela et al., "Design of Grid-Side Electromagnetic Interference Filters in AC Motor Drives with Motor-Side Common Mode Active Compensation," IEEE Transactions on Electromagnetic Compatibility, IEEE Service Center, vol. 51, No. 3, Aug. 1, 2009, pp. 673-682.

* cited by examiner

US 9,130,541 B2

ACTIVE EMC FILTER

REFERENCE

The present application claims convention priority of the Swiss patent application CH13/0798 which is hereby incorporated by reference.

FIELD OF THE INVENTION

The present invention concerns an electromagnetic compatibility (EMC) filter, whose aim is the attenuation or the suppression of electromagnetic disturbances generated by electric devices, which could otherwise affect other devices in proximity or connected to the same power line. More specifically, an embodiment concerns an EMC mitigation system for an electric motor connected to a power line through a rectifier and a variable inverter, but the invention is not limited to this specific application. The EMC filter can also be called Active Residual Current Compensator.

DESCRIPTION OF RELATED ART

It is currently known in the art to use filters on power lines for the mitigation of electromagnetic noise generated by the switching frequencies generated by modern electrical equipment during use. Typically, the power line filters are low pass filters having passive LC components that provide attenuation of incoming and outgoing line disturbances over a wide band of frequencies in both common mode and differential modes.

FIG. 1 illustrates a known system for ensuring EMC compatibility in a motor driver. The motor M receives a three-phase supply from the inverter with a variable frequency, wherein the inverter is here represented schematically by the block PWR. Conventionally, the inverter PWR is supplied by a DC voltage generated by a rectifying bridge, here represented by block B6, that is connected to a suitable AC power source, here represented as a three-phase power network, but that may also be a single-phase network.

It is known to insert various electric filters in systems like the one depicted in FIG. 1 in order to attenuate the inverter-generated noise. FIG. 1 shows, as an example, a LC 'T' filter between the AC network and the bridge, comprising a pair of chokes Ln, Lb with a bank of 'X' capacitors C×N connecting each of the phases to a star point, plus a filter capacitor Cst between said star point and a reference potential, which has the important function of increasing the attenuation with respect to common-mode noise components.

It is also known to insert EMC low pass filters in the DC link between a rectifying bridge and an inverter; in FIG. 1, this is achieved by the 'X' capacitors C×U that generate a star point between the two DC rails DC+ and DC−, and the filter capacitor CstU, between the star point and a reference potential. As in the previous instance, the CstU is important to attenuate the common-mode noise component. An additional capacitor CDC, connected between the rails, increases the attenuation to differential-mode noise.

In electrical installations with switched inverters, there are operating leakage currents. This is due to common-mode noise present at the output of the inverter, and is therefore linked to the physical working principles of the inverter. One of the best-known problems deriving from this state of affairs is the malfunctioning of residual-current protective switches that may be tripped without a real need, because they cannot discriminate between a fault current and other leakage currents. The consequences are often delays to put a circuit back into service and costs due to production losses.

The research of these events and faults have shown, in the past, that often the network filter that are provided for EMC compliance in almost all installations of any power level induces an increase of leakage current—be it the nominal operation current or that at harmonic frequency. This means that installations with an EMC filter are considerably more prone to tripping the residual current switch due to leakage current than those without an EMC filter.

A leakage current is in general a disturbing signal that flows on all phases of the network in common mode, to or from the drive system. The return path of this current to the network is made across the housing, the protective earth and reference ground. Common-mode currents are designated currents that flow on all the phase conductors with the same amplitude and phase. Therefore, common-mode currents can be determined via measurements of the sum current. The leakage current is different from common-mode current in that a measure of the frequency is also in general taken, in order to discriminate common-mode (inverter) current from leakage current.

WO2008/020029, U.S. Pat. No. 6,636,107, U.S. Pat. No. 7,061,195, and U.S. Pat. No. 6,920,053 describe motor drive circuits that attempts to alleviate the leakage currents introduced by the EMC filter in the DC Link of systems such as represented in FIG. 1, by generating a compensating current in a linear stage that is driven by a differential transformer. The compensating current/voltage is linear proportional to a measured current/voltage. These solutions rely however on high-current linear amplifiers that are expensive, lossy and bulky.

It is therefore an aim of the present invention to provide a filter unit and a EMC reduction system that alleviate the shortcomings of the known solutions, in particular with respect to leakage currents, without unduly affecting cost, size, and reliability. The present invention endeavours to correct actively the characteristics of the filter that have so far led to leakage currents, without resorting to other suppression devices that would be much more complex and expensive.

BRIEF SUMMARY OF THE INVENTION

According to the invention, these aims are achieved by an active EMC filter and an EMC management system with such an active EMC filter. The active EMC filter comprises a number of capacitors connected between each phase and a star point and a filter capacitor connected between the star point and ground. A control unit drives switching devices digitally either in an ON-state or in an OFF-state, such as to limit/reduce a leakage current into the mains by injecting electrical charges into the star point. A smoothing circuit smooths the current during the ON-state.

The combination of digital switching and the smoothing circuit allows to use sharp ON-OFF charging pulses at the star point of the capacitors in order to reduce the leakage current. The smoothing circuit transforms the sharp ON-OFF charging pulses into smooth charging pulses. The digital switching has the advantage that there is no need for a linear amplification of the leakage current measured. In addition, the switches are only operated in OFF and ON position, such that the switches can operate only the in two low loss states. In all states between the OFF and the ON position, energy would be dissipated in the switches. In the ON position the switch is preferably in saturation such that the energy dissipation is reduced. In addition, the digital control allows a non-linear control of the charges entered at the star point such that with minimal use of energy and minimal creation of heat an optimal reduction of the leakage current is achieved.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
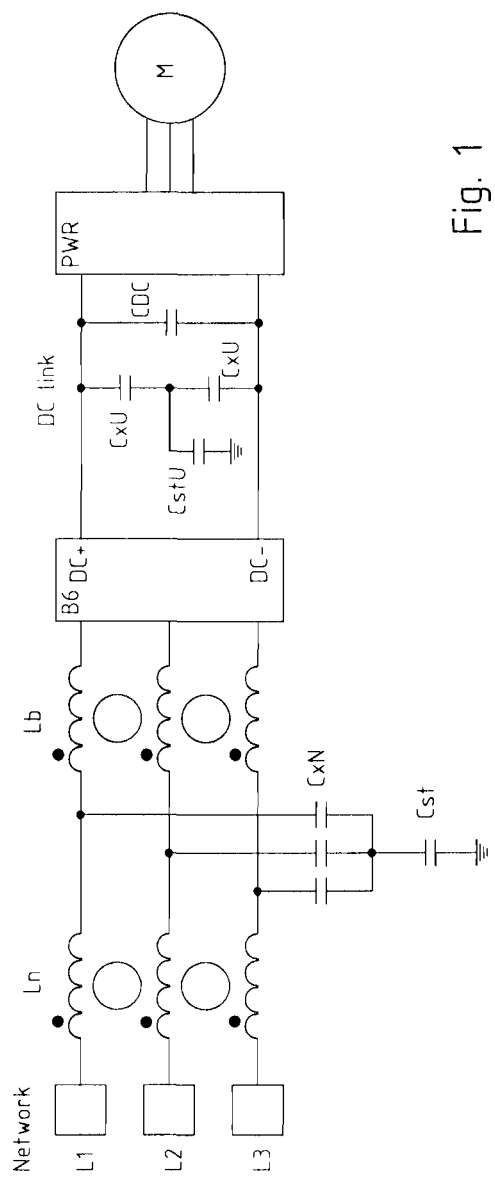
FIG. 1 represents schematically a motor drive with a two-stage passive EMC filter.
Figure 2:
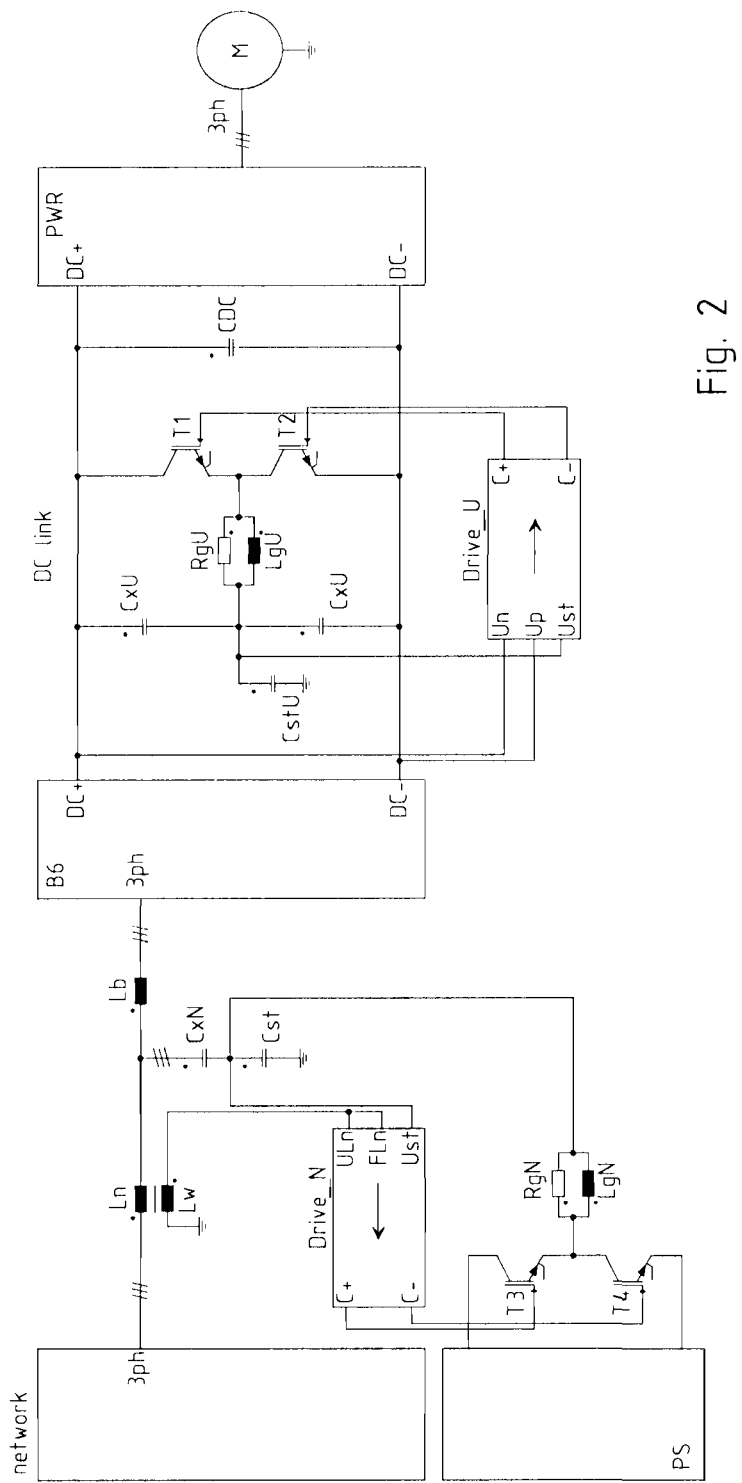
FIGS. 2 and 3 show schematically a possible EMC management system that includes one or two EMC filters according to one embodiment.

FIG. 2 shows an embodiment of an EMC management system as shown in FIG. 1. A first active EMC filter is arranged between the AC network and the rectifying bridge B6 in the AC link and a second active EMC filter is arranged between the rectifying bridge B6 and the switched bridge PWR of the inverter in the DC link. FIG. 2 represents the AC link in unifilar fashion, and therefore only one representative phase of the three phases of the AC link is shown.

The first active EMC filter comprises as passive filter elements as already described in FIG. 1 two filter chokes Ln and Lb in each phase, an 'X'-capacitor C×N connected between each phase (here three) and a star point and a filter capacitor Cst connected between the star point and ground. Thus, the passive filter part of the first active EMC filter in the AC-link has a LCL structure.

In this example, chokes Ln and Lb are three-phase current-compensated chokes. The filter choke Ln must carry the same load current as the filter choke Lb, but the common-mode current is however sensibly reduced by the other filter components. The magnetic flux in this filter choke Ln is therefore considerably lower. The filter chokes Ln and Lb are not essential for the invention, but decouple the two compensation stages and therefore simplify the control. Alternatively, only the filter chokes Ln for each phase or only the filter chokes Lb could be used or no choke could be used in the AC-link.

The capacitors C×N are connected respectively to the phases of the AC-link between the two filter chokes Ln and Lb. In one example, the capacitors C×N are realized as capacitor banks. The invention is not limited to a three-phase system, and could be applied to DC-supplied systems as in the second active EMC filter, or to AC-supplied systems having one, two, three or more phases, in which case the number of capacitors C×N would need to be varied according to the number of phases.

The first active EMC filter comprises as an active filter part a detector, a control unit Drive_N, two switches T3 and T4 and a smoothing circuit.

The detector is configured to detect a measure for a leakage current as input for the control unit Drive_N. In this example, the leakage current in the AC-link is detected by the voltage drop across the filter choke Ln. It is picked up by an auxiliary winding Lw. The voltage is, assuming that the core does not saturate, proportional to the leakage current traversing the choke. Furthermore this voltage can integrated over time to detect the magnetizing status of the choke in order to avoid saturation. However, any other means or measure for determining the leakage current can be used as detector.

The control unit Drive_N is configured to control the switches T3 and T4 such that an electric charge is introduced at the star point. This charge is generated in such way, that residual currents are forced to flow into the capacitors and not into the mains. The instantaneous choke voltage ULn and the instant voltage of the star-point capacitor (Ust) are used by the control unit Drive_N as input control variables. Preferably, said auxiliary winding Lw on a ring core of the filter choke Ln is used to pick up the common-mode choke voltage ULn. Via integration of this voltage ULn, the control unit Drive_N determines the magnetic flux Φ in the core of filter choke Ln. This is used in the control unit Drive_N to set the necessary counter-voltage for the compensation of the flux. The required counter voltage is compared with the instantaneous voltage at the filter choke Ln (ULn) and an error voltage is derived. The error voltage represents the variation that must be impressed to the voltage at the star point capacitor Cst. The control unit Drive_N compares the values of the instantaneous available supply voltage with the instantaneous capacitor voltage. From that is determined the electrical charge that is necessary to inject onto Cst in order to bring its voltage to the desired value. Since the relation between the necessary charge and the input variables is non-linear, preferably the time of the ON state of the switches T3 or T4 are controlled using a lookup table or calculated by simplified formulas. The control unit Drive_N comprises two control signals C+ and C− as output signals to control the two switches T3 and T4. Depending on the kind of charge needed in the star point, either T3 or T4 is switched on for a certain time in order to reduce the leakage current.

The two switches T3 and T4 are connected in series. A first terminal of the first switch T3 is connected with a power source PS and a second terminal of the first switch T3 is connected with a second terminal of the second switch T4. A first terminal of the second switch is connected to the power source PS. The power source PS is a fix DC voltage, wherein the first terminal of the first switch T3 is connected with a first terminal of the power source PS and the first terminal of the second switch T4 is connected with a second terminal of the power source PS. The power supply can be obtained by a dedicated power adapter or the power supply PS is galvanically isolated from the intermediate DC link of the inverter. In an alternative example, the power supply for the switches T3 and T4 could be supplied by the DC link directly. Each switch T3 and T4 has a control terminal for controlling the switch between the first and second terminal. The control terminal of the first switch T3 is connected with the output signal C+ of the control unit Drive_N. The control terminal of the second switch T4 is connected with the output signal C− of the control unit Drive_N. In the example in FIG. 2, the switches T3 and T4 are IGBTs. However, the invention is not restricted to this embodiment and encompasses all possible switching means including but not limited to: MOSFETS, JFETS, SiC power transistors, power HEMT, and solid-state power switching modules and devices of any kind.

The control unit and the switches T3 and T4 are configured to digitally switch T3 and T4 between an ON state and an OFF state. In the OFF state, the first terminal is not connected to the second terminal of the switch. In the ON state, the switch is in saturation and the first terminal and the second terminal of the switch are fully connected. Either by the use of digital switches which allow only an ON state or an OFF state and/or by the use of a corresponding control signal having only an ON state and an OFF state, a digital (or binary) switching can be realized.

The smoothing circuit is connected on one side between switches T3 and T4 and on the other side to the star point of the capacitors C×N. The smoothing circuit is adapted to smooth the steps between the ON-state and the OFF-state of the switches T3 and T4. In this example, the smoothing circuit comprises a smoothing inductor LgN and a resistor RgN in parallel. The resistor RgN damps the oscillations between the capacitors and the smoothing inductor LgN, but the resistor is optional and not required for the present embodiment. Instead of the smoothing inductor LgN also other smoothing electric elements or circuits could be used.

The active filter part is configured to limit a leakage current flowing in the mains. Instead of high-current linear amplifiers that are expensive, lossy, bulky, and prone to failures, the first active EMC filter controls two switches T3 and T4 digitally only between ON and OFF states and varies the length and/or the timing of the ON and OFF states of the switches T3 and T4 in dependence of the detected leakage current so that an electrical charge is delivered to the star point to reduce the leakage current in the mains. Especially, the control signals for the switches T3 and T4 are not linear proportional to the leakage current (not even temporarily). The control unit is different from a pulse width modulation (PWM) control, because it does not switch the switches T3 or T4 that fast on and off in order to yield a resulting AC-voltage or a voltage linear to the measured leakage current, but it switches T3 or T4 ON for a short moment to induce a certain charge in order to reduce the leakage current.

In this example, the necessary electrical charge for the star point is delivered by a pulsed triangle current, obtained by connecting one terminal of the inductor LgN to a fixed DC voltage produced by the power supply PS. The control unit Drive_N switches on selectively one of the switches T3 and T4 for a suitable time dependent from the input variables ULn and Ust, as explained above. The required ON times can be calculated from the input variables. Alternatively, the required ON times can be obtained from pre-programmed look-up tables in the control unit Drive_N. Preferably, the timing of the compensation pulse is chosen sensibly faster than the frequency of the mains harmonics and the operation frequency of the inverter. In order to obtain a determined current shape, and a defined electric charge and a defined voltage rise, the current passes preferably through the smoothing inductance LgN that transforms a voltage step into a current triangle waveform. Optionally, the resistance RgN is placed in parallel to the smoothing inductance LgN, to reduce the oscillation between LgN and the output capacity of the switches T3 and T4.

If a leakage current flows from the network through Ln, it is recognized by the control unit Drive_N as positive magnetic flux. In reaction the voltage at the network-side star point capacitor Cst is increased. It results a counter current through Ln that counteracts the magnetic flow and the leakage current, and compensates the magnetic flux in the choke Ln.

The second active EMC filter in the DC-link comprises as passive filter elements as already described in FIG. 1, an 'X'-capacitor C×U connected between each phase (here two) and a star point, a filter capacitor CstU connected between the star point and ground and an optional capacitor CDC between the two phases. The capacitors C×U and CstU are carried out as in the first active EMC filter. The phases in the DC Link are also call DC+ rail and DC− rail.

The second active EMC filter comprises an active filter part with a control unit Drive_U, two switches T1 and T2 and a smoothing circuit which are realized and arranged as in the first active EMC filter, if not otherwise mentioned.

The voltage Un and Up at the two phases DC+ and DC− are led into the control unit Drive_U as input variables for detecting the common mode voltage of the DC-link with respect to protective earth. The voltage at the star point is also led in the control unit Drive_U as input variable. On the basis of the common mode voltage and the voltage at the star point, the switches T1 and T2 are controlled digitally between ON and OFF states by the control signals C+ and C−.

The switches T1 and T2 in this example do not have a separated power source PS, but the DC voltage between the DC+ and DC− is used for the switches T1 and T2.

The smoothing circuit is realised as in the first active EMC filter by an inductance LgU and an optional resistance RgU in parallel.

As in the first active EMC filter, the control unit Drive_U digitally switches the switches T1 and T2 such that an electrical charge is introduced in the star point which attracts the leakage current to flow in the active filter part (compensator). The compensation stage in the DC link compensates the voltage present at the star point between the capacitors C×U in a totally analogous way as the compensation stage in the network side, described previously. In this case, the input signals for the control unit Drive_U are the rail voltages Up, Un, and the star voltage Ust. The IGBT T1, T2 are switched by the control unit Drive_U in order to generate, through the inductance LgU, triangular current pulses that control the Ust voltage, as described above.

Though also in the DC link, the common-mode noise current is measured and compensated by regulating the star voltage of the "X"-capacitors C×U. In this manner the leakage current is compensated.

Figure 3:
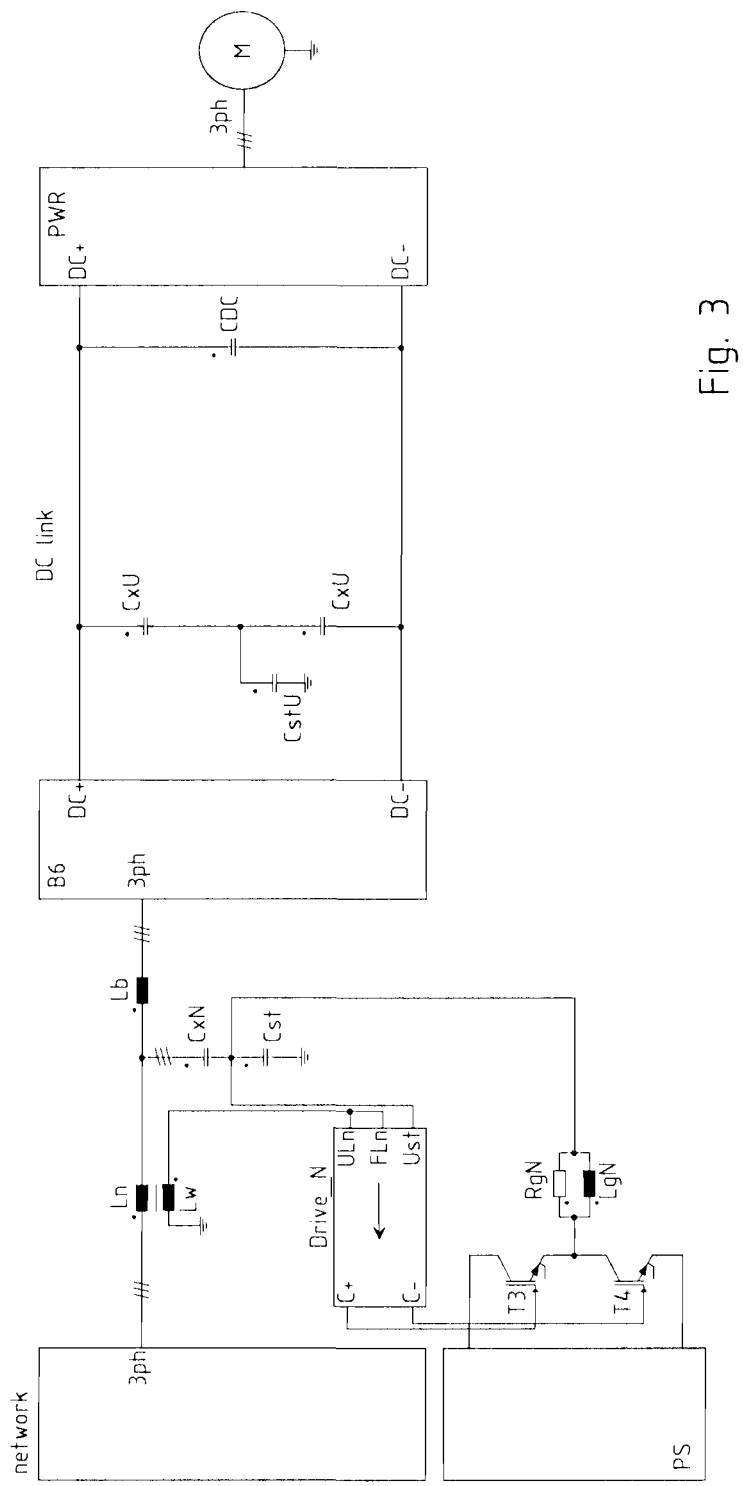

In another example schematically represented in FIG. 3, the EMC management system comprises only the first active EMC filter in the AC-link and only the passive part of the second active EMC filter in the DC link.

Figure 4:
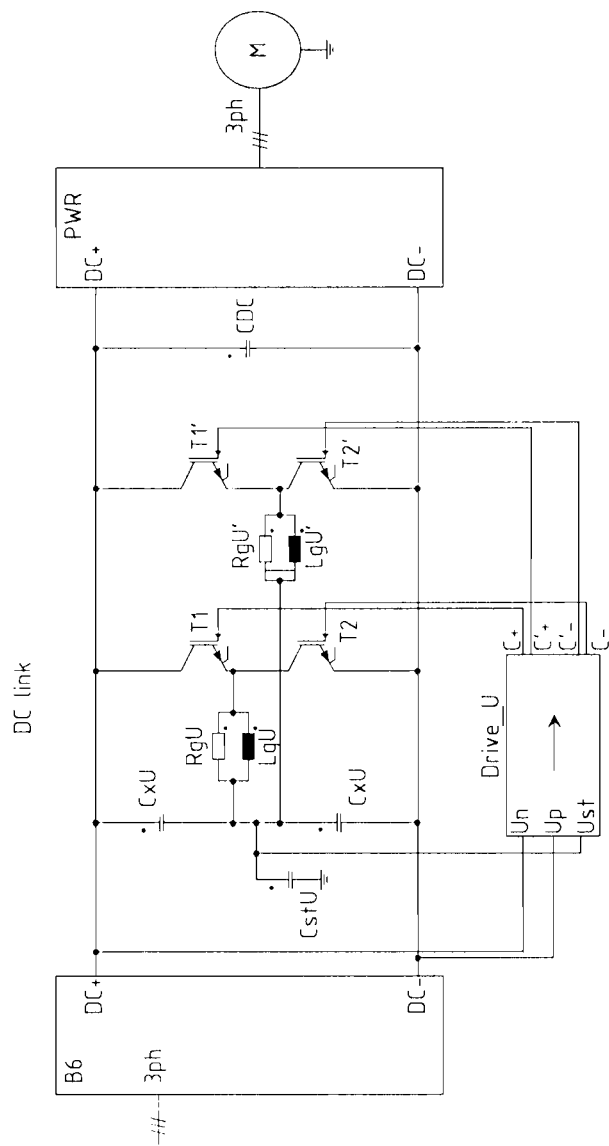
FIG. 4 illustrates schematically a further embodiment of the EMC management system.

In a further variant of the invention, schematically represented in FIG. 4, the compensation circuit includes an additional switching half-bridge stage with two further switches T1' and T2' and another inductor LgU', connected in parallel to the switching half-bridge including T1 and T2. The additional switches are with a half-cycle delay with respect to T1 and T2. In this way the frequency of compensation stage at the inverter side is effectively doubled, and the reaction time is accordingly shortened. In addition, T1 and T2 are less thermally challenged. FIG. 4 represents, for clarity, only the compensation stage in the DC link. It must be understood, however, that the invention includes realization having a similar double-bridge arrangement in the network side compensation stage, or in both.

The examples of the active EMC filter were shown only with a DC network with two phases and AC network with three phases. However, the invention is not restricted to those examples, but any other number of phases of a DC network or an AC network is possible for the active EMC filter.

LEGEND OF SYMBOLS USED IN THE DRAWINGS

///, 3ph: Three-phase conductor
Network: Connection terminals of the supply network
B6: Rectifying bridge of the inverter
CDC: Intermediate capacitor of the inverter
PWR: Switched bridge of the inverter
M: Connected machine/motor/drive
Drive_N: Control of the network-side compensation stage
Drive_U: Control of the inverter-side compensation stage
Ln: three-phase current-compensated choke, network side
Lw: auxiliary coil
Lb: three-phase current-compensated choke, bridge side
C×N: Capacitors to star point, network side Cst: Star-ground capacitor, network side
CxU: Capacitors to star point, inverter/DC link side
CstU: Star-ground capacitor, inverter/DC link side
T3, T4: switches of the active compensation stage, network side
PS: galvanic isolated supply of the compensation stage
LgN: compensation Inductor, network side
RgN: parallel resistance, network side
T1, T2: switches of the active compensation stage, inverter side
LgU: Compensation inductor, inverter side
RgU: parallel resistance, inverter side
ULn: instantaneous voltage of the network-side choke
FLn: instantaneous flux of the network-side choke
Ust: instantaneous voltage at the star point
Up: instantaneous voltage to ground of the DC+ rail
Un: instantaneous voltage to ground of the DC− rail
C+: drive signal for the positive switches
C−: drive signal for the negative switches

The invention claimed is:

1. Active EMC filter connectable between an electric power source and an electric load, comprising:
   capacitors connected between conductors of said power source and a star point electric node;
   a filter capacitor connected between said star point and ground;
   a half-bridge comprising two switching devices connected in cascade between a positive supply voltage and a negative supply voltage;
   a smoothing circuit connected between a common node of said switching devices and said star point; and
   a control unit driving said switching devices digitally either in an ON-state or in an OFF-state, such as to limit a leakage current.

2. The active EMC filter of claim 1, wherein the switching devices are in the ON-state in saturation.

3. The active EMC filter of claim 1, wherein the smoothing circuit comprises an inductor.

4. The active EMC filter of claim 3, wherein the smoothing circuit comprises a resistor in parallel to the inductor of the smoothing circuit.

5. The active FMC filter of claim 1, wherein the control unit is sensitive to the voltage present at the star point.

6. The active EMC filter of claim 1, wherein the power source is a three-phase AC source, or a DC power source.

7. The active EMC filter of claim 1, wherein the control unit is sensitive to the magnetic flux in and/or voltage across a choke that is included in the LMC filter.

8. The active EMC filter of claim 7, wherein the choke is connected between the electric power source and the load.

9. The active EMC filter of claim 8, the power source being a three-phase AC source, and wherein the choke is current-compensated.

10. EMC management system comprising a three-phase AC source, connected by a first active EMC filter to a rectifying bridge, connected by DC link that includes a second active EMC filter to a switched bridge, which is driven so as to generate a variable AC supply, wherein the first active EMC filter comprises:
    first capacitors connected between conductors connecting said power source with the rectifying bridge and a first star point electric node;
    a first filter capacitor connected between said first star point and ground;
    a first half-bridge comprising two first switching devices connected in cascade between a positive supply voltage and a negative supply voltage;
    a first smoothing circuit connected between a common node of said first switching devices and said first star point; and
    a first control unit driving said first switching devices digitally either in an ON-state or in an OFF-state, such as to limit a leakage current;
    wherein the second active EMC filter comprises:
    second capacitors connected between conductors connecting said rectifying bridge with said inverter and a second star point electric node;
    a second filter capacitor connected between said second star point and ground;
    a second half-bridge comprising two second switching devices connected in cascade between a positive supply voltage and a negative supply voltage;
    a second smoothing circuit connected between a common node of said second switching devices and said second star point; and
    a second control unit driving said second switching devices digitally either in an ON-state or in an OFF-state, such as to limit a leakage current.

11. The EMC management system of claim 10, wherein the switching devices of the first active EMC filter and of the second active EMC filter are in the ON-state in saturation.

12. The EMC management system of claim 10, wherein the first smoothing circuit and the second smoothing circuit comprise an inductor.

13. The EMC management system of claim 10, wherein the first control unit is sensitive to the voltage present at the first star point and the second control unit is sensitive to the voltage present at the second star point.

14. The EMC management system of claim 10, wherein the first control unit is sensitive to the magnetic flux in and/or voltage across a choke that is included in the conductor between the AC source and the rectifying bridge.

15. The EMC management system of claim 14, wherein the choke is current-compensated.

* * * * *